United States Patent
Yamamoto et al.

(10) Patent No.: US 10,422,035 B2
(45) Date of Patent: Sep. 24, 2019

(54) THIN FILM FORMING METHOD AND THIN FILM FORMING APPARTUS

(71) Applicant: TOKYO ELECTRON LIMITED, Tokyo (JP)

(72) Inventors: Kazuya Yamamoto, Oshu (JP); Yuichi Ito, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 501 days.

(21) Appl. No.: 14/828,653

(22) Filed: Aug. 18, 2015

(65) Prior Publication Data

US 2015/0354062 A1    Dec. 10, 2015

Related U.S. Application Data

(62) Division of application No. 14/107,787, filed on Dec. 16, 2013, now Pat. No. 9,139,904.

(30) Foreign Application Priority Data

Dec. 18, 2012 (JP) .................... 2012-275271
Oct. 16, 2013 (JP) .................... 2013-215719

(51) Int. Cl.
*C23C 16/40* (2006.01)
*C23C 16/50* (2006.01)
(Continued)

(52) U.S. Cl.
CPC ............ *C23C 16/402* (2013.01); *C23C 16/40* (2013.01); *C23C 16/45523* (2013.01); *C23C 16/45557* (2013.01); *C23C 16/52* (2013.01)

(58) Field of Classification Search
USPC ..................... 118/696, 697, 698; 156/345.24
See application file for complete search history.

(56) References Cited

U.S. PATENT DOCUMENTS 4,783,343 A * 11/1988 Sato .................... C23C 16/4482
                                                              118/692
4,966,861 A * 10/1990 Mieno ............... H01L 21/02639
                                                           148/DIG. 17
(Continued)

FOREIGN PATENT DOCUMENTS

JP          61017151 A  *  1/1986   ......... C23C 16/4412
JP          1-179710 A     7/1989
(Continued)

OTHER PUBLICATIONS

Johnson, Richard W., et al., "A Brief Review of Atomic Layer Deposition: from Fundamentals to Applications", Materials Today, vol. 17, No. 5, pp. 236-246, Jun. 2014.
(Continued)

*Primary Examiner* — Rudy Zervigon
(74) *Attorney, Agent, or Firm* — Nath, Goldberg & Meyer; Jerald L. Meyer

(57) ABSTRACT

A thin film forming method for forming a thin film on a workpiece accommodated within a reaction chamber includes a first operation of supplying a first source gas and a second source gas into the reaction chamber, and a second operation of stopping the supply of the first source gas, supplying the second source gas into the reaction chamber and setting an internal pressure of the reaction chamber higher than an internal pressure of the reaction chamber set in the first operation. The first operation and the second operation are alternately repeated a plurality of times.

5 Claims, 8 Drawing Sheets

(51) Int. Cl.
*C23C 16/455* (2006.01)
*C23C 16/52* (2006.01)

(56) References Cited

U.S. PATENT DOCUMENTS

| | | | | |
|---|---|---|---|---|
| 5,091,207 | A * | 2/1992 | Tanaka | C23C 16/52 118/50 |
| 5,220,515 | A * | 6/1993 | Freerks | H01L 21/67017 702/47 |
| 5,246,500 | A * | 9/1993 | Samata | C23C 16/455 118/715 |
| 5,284,179 | A * | 2/1994 | Shikida | F04B 43/043 137/334 |
| 5,368,685 | A * | 11/1994 | Kumihashi | H01J 37/32082 156/345.26 |
| 5,470,540 | A * | 11/1995 | Pes | B01J 3/02 422/145 |
| 5,565,038 | A * | 10/1996 | Ashley | B08B 3/08 134/2 |
| 5,685,912 | A * | 11/1997 | Nishizaka | C23C 16/4412 118/715 |
| 5,738,951 | A * | 4/1998 | Goujard | C04B 35/565 427/585 |
| 5,777,300 | A * | 7/1998 | Homma | H01L 21/67115 118/715 |
| 5,957,751 | A * | 9/1999 | Govzman | B24B 37/30 451/8 |
| 5,968,374 | A * | 10/1999 | Bullock | H01J 37/32082 216/16 |
| 6,022,483 | A * | 2/2000 | Aral | B01J 3/006 156/345.26 |
| 6,030,902 | A * | 2/2000 | Donohoe | C23C 16/4412 216/67 |
| 6,093,082 | A * | 7/2000 | Somekh | B24B 37/30 451/9 |
| 6,149,974 | A * | 11/2000 | Nguyen | C23C 16/0272 427/255.29 |
| 6,186,154 | B1 * | 2/2001 | Huang | C23C 16/4405 134/1.1 |
| 6,203,613 | B1 | 3/2001 | Gates | |
| 6,244,932 | B1 * | 6/2001 | Govzman | B24B 37/30 451/8 |
| 6,273,954 | B2 * | 8/2001 | Nishikawa | C23C 16/455 118/692 |
| 6,287,980 | B1 * | 9/2001 | Hanazaki | H01J 37/3244 156/345.28 |
| 6,305,314 | B1 * | 10/2001 | Sneh | C23C 16/44 118/723 E |
| 6,315,859 | B1 * | 11/2001 | Donohoe | C23C 16/4412 118/715 |
| 6,343,973 | B1 * | 2/2002 | Somekh | B24B 37/30 451/9 |
| 6,383,300 | B1 * | 5/2002 | Saito | C23C 16/345 118/715 |
| 6,451,119 | B2 * | 9/2002 | Sneh | C23C 16/44 118/715 |
| 6,517,415 | B2 * | 2/2003 | Govzman | B24B 37/30 451/9 |
| 6,540,838 | B2 * | 4/2003 | Sneh | C23C 8/00 118/715 |
| 6,547,641 | B2 * | 4/2003 | Zuniga | B24B 37/0053 451/288 |
| 6,566,183 | B1 * | 5/2003 | Chen | H01L 21/3185 438/230 |
| 6,585,823 | B1 * | 7/2003 | Van Wijck | 117/101 |
| 6,607,987 | B2 * | 8/2003 | Donohoe | C23C 16/4412 438/438 |
| 6,626,186 | B1 * | 9/2003 | Hillman | C23C 16/14 134/1.1 |
| 6,705,924 | B2 * | 3/2004 | Somekh | B24B 37/30 451/9 |
| 6,800,570 | B2 * | 10/2004 | Choi | C23C 16/405 438/785 |
| 6,807,971 | B2 * | 10/2004 | Saito | C23C 16/345 134/1 |
| 6,881,295 | B2 * | 4/2005 | Nagakura | C23C 16/401 118/715 |
| 6,916,398 | B2 | 7/2005 | Chen | |
| 7,011,710 | B2 * | 3/2006 | Bang | C23C 16/401 118/715 |
| 7,052,576 | B2 * | 5/2006 | Park | C23C 16/45557 118/688 |
| 7,056,806 | B2 * | 6/2006 | Basceri | C23C 16/34 438/448 |
| 7,258,892 | B2 * | 8/2007 | Beaman | C23C 16/46 118/666 |
| 7,279,398 | B2 * | 10/2007 | Basceri | C23C 16/34 257/E29.09 |
| 7,344,755 | B2 * | 3/2008 | Beaman | C23C 16/4404 427/248.1 |
| 7,393,561 | B2 * | 7/2008 | Paranjpe | C23C 16/345 427/248.1 |
| 8,235,001 | B2 * | 8/2012 | Sano | C23C 16/4408 118/695 |
| 8,303,712 | B2 * | 11/2012 | Nakashima | C23C 16/45591 118/715 |
| 8,366,868 | B2 * | 2/2013 | Okuda | C23C 16/4405 118/695 |
| 8,465,811 | B2 | 6/2013 | Ueda | |
| 8,925,481 | B2 * | 1/2015 | Shao | C23C 16/52 118/663 |
| 8,980,679 | B2 * | 3/2015 | Im | C23C 16/45531 257/42 |
| 9,045,825 | B2 * | 6/2015 | Kaga | C23C 16/308 |
| 9,127,358 | B2 * | 9/2015 | Inoue | C23C 16/4481 |
| 9,466,477 | B2 * | 10/2016 | Saito | C23C 16/34 |
| 9,472,398 | B2 * | 10/2016 | Saito | C23C 16/34 |
| 9,644,266 | B2 * | 5/2017 | Nasu | C23C 16/4408 |
| 9,803,281 | B2 * | 10/2017 | Soininen | C23C 16/45551 |
| 10,026,607 | B2 * | 7/2018 | Takasawa | C23C 16/45531 |
| 2001/0048981 | A1 * | 12/2001 | Suzuki | C23C 16/4408 427/569 |
| 2002/0192369 | A1 * | 12/2002 | Morimoto | C23C 16/14 427/248.1 |
| 2003/0000924 | A1 * | 1/2003 | Strang | C23C 16/45523 216/86 |
| 2003/0006003 | A1 * | 1/2003 | Matsuoka | G02F 1/1339 156/272.2 |
| 2003/0036272 | A1 * | 2/2003 | Shamouilian | B08B 7/00 438/691 |
| 2003/0134038 | A1 * | 7/2003 | Paranjpe | C23C 16/345 427/248.1 |
| 2003/0183171 | A1 * | 10/2003 | Sneh | C23C 8/00 118/724 |
| 2003/0209193 | A1 * | 11/2003 | Van Wijck | C23C 16/4412 117/84 |
| 2003/0230322 | A1 * | 12/2003 | Hillman | C23C 16/4408 134/11 |
| 2004/0011292 | A1 * | 1/2004 | Shimizu | C23C 16/4481 118/723 VE |
| 2004/0097098 | A1 * | 5/2004 | Nagakura | C23C 16/4408 438/760 |
| 2004/0224504 | A1 | 11/2004 | Gadgil | |
| 2004/0259383 | A1 * | 12/2004 | Choi | C23C 16/405 438/785 |
| 2005/0020039 | A1 * | 1/2005 | Kikuchi | C23C 16/4401 438/509 |
| 2005/0136657 | A1 * | 6/2005 | Yokoi | C23C 16/34 438/680 |
| 2005/0145333 | A1 * | 7/2005 | Kannan | C23C 16/4412 156/345.24 |
| 2005/0221021 | A1 | 10/2005 | Strang | |
| 2005/0223979 | A1 * | 10/2005 | Shajii | C23C 16/45527 118/692 |
| 2005/0282365 | A1 * | 12/2005 | Hasebe | C23C 16/24 438/513 |
| 2006/0128127 | A1 * | 6/2006 | Seo | C23C 16/34 438/584 |

(56) References Cited

U.S. PATENT DOCUMENTS

| | | | |
|---|---|---|---|
| 2006/0205187 A1* | 9/2006 | Zheng | C23C 16/45546 438/478 |
| 2006/0213440 A1* | 9/2006 | Zheng | C23C 16/45546 118/715 |
| 2008/0050884 A1* | 2/2008 | Koyanagi | C23C 16/45527 438/387 |
| 2008/0264337 A1* | 10/2008 | Sano | C23C 16/4408 118/704 |
| 2008/0286981 A1 | 11/2008 | Hasper | |
| 2009/0087977 A1 | 4/2009 | Spuller | |
| 2009/0163037 A1* | 6/2009 | Miya | C23C 16/40 438/778 |
| 2009/0170345 A1 | 7/2009 | Akae | |
| 2009/0178694 A1* | 7/2009 | Okuda | C23C 16/4405 134/22.12 |
| 2009/0197402 A1* | 8/2009 | Nakashima | C23C 16/45591 438/584 |
| 2010/0167527 A1 | 7/2010 | Wu | |
| 2011/0031593 A1* | 2/2011 | Saito | C23C 16/34 257/632 |
| 2012/0073672 A1* | 3/2012 | Ding | C23C 16/448 137/14 |
| 2012/0180719 A1* | 7/2012 | Inoue | C23C 16/4481 118/708 |
| 2012/0214300 A1* | 8/2012 | Kaga | C23C 16/308 438/597 |
| 2012/0304930 A1* | 12/2012 | Verdict | C23C 16/4407 118/715 |
| 2013/0092084 A1* | 4/2013 | Shao | C23C 16/52 118/712 |
| 2013/0180451 A1* | 7/2013 | Horiuchi | H01L 21/67017 118/715 |
| 2014/0170320 A1* | 6/2014 | Yamamoto | C23C 16/402 427/255.7 |
| 2016/0053377 A1* | 2/2016 | Taniyama | H01L 21/67017 438/758 |
| 2016/0240370 A1* | 8/2016 | Yamasaki | C23C 14/24 |
| 2018/0209033 A1* | 7/2018 | Yamasaki | C23C 14/24 |

FOREIGN PATENT DOCUMENTS

| | | | |
|---|---|---|---|
| JP | 2-93071 A | | 4/1990 |
| JP | 3-248427 A | | 11/1991 |
| JP | 6-275608 A | | 9/1994 |
| JP | 2001-068468 A | | 3/2001 |
| JP | 2001144033 A | * | 5/2001 |
| JP | 2007-095885 A | | 4/2007 |
| KR | 10-2011-0129344 A | | 12/2011 |

OTHER PUBLICATIONS

Elam, J.W., et al., "Viscous Flow Reactor with Quartz Crystal Microbalance for Thin Film Growth by Atomic Layer Deposition", Review of Scientific Instruments, vol. 73, No. 8, pp. 2981-2987, Aug. 2002.

* cited by examiner

THIN FILM FORMING METHOD AND THIN FILM FORMING APPARTUS

CROSS-REFERENCE TO RELATED APPLICATIONS

This is a Divisional Application of U.S. patent application Ser. No. 14/107,787, filed Dec. 16, 2013, an application claiming benefit of Japanese Patent Application No. 2012-275271, filed on Dec. 18, 2012, and Japanese Patent Application No. 2013-215719, filed on Oct. 16, 2013, in the Japan Patent Office, the disclosure of each of which is incorporated herein in their entirety by reference.

TECHNICAL FIELD

The present disclosure relates to a thin film forming method and a thin film forming apparatus.

BACKGROUND

In the related art, LP-CVD (Low Pressure Chemical Vapor Deposition) is used in forming a film such as a silicon oxide film or the like. In the film formation using the LP-CVD, a film having a desired thickness is formed by supplying a gas, the flow rate of which is adjusted to a constant value, into a pressure-controlled reaction chamber for a predetermined time.

In recent years, the structural change or miniaturization of a semiconductor device poses a problem in that the conventional process cannot be directly applied because the coverage performance is low under the conventional LP-CVD film forming conditions. This problem is particularly true when film formation is performed with respect to a pattern of a STI (Shallow Trench Isolation) shape or a hole shape which has a high aspect ratio. In the LP-CVD film formation, there is a demand for the reduction of an impurity concentration in a film. Thus, a demand has existed for a method of forming a thin film having good properties.

SUMMARY

The present disclosure includes a thin film forming method and a thin film forming apparatus capable forming a thin film having good properties.

Furthermore, some embodiments of the thin film forming method and thin film forming apparatus are capable of forming a thin film having good coverage performance.

Moreover, some embodiments of the thin film forming method and thin film forming apparatus are capable of forming a thin film having a reduced impurity concentration.

According to one embodiment of the present disclosure, there is provided a thin film forming method for forming a thin film on a workpiece accommodated within a reaction chamber, including: a first operation of supplying a first source gas and a second source gas into the reaction chamber; and a second operation of stopping the supply of the first source gas, supplying the second source gas into the reaction chamber and setting an internal pressure of the reaction chamber higher than an internal pressure of the reaction chamber set in the first operation and the second operation being alternately repeated a plurality of times.

According to another embodiment of the present disclosure, there is provided a thin film forming method for forming a thin film on a workpiece accommodated within a reaction chamber, including: a first operation of supplying a film forming gas into the reaction chamber to form a thin film on the workpiece accommodated within the reaction chamber; and a modifying operation of supplying a modifying gas into the reaction chamber to modify the thin film formed on the workpiece, the modifying operation being performed after a thin film having a desired thickness is formed on the workpiece by alternately repeating the first operation and the modifying operation a plurality of times or by repeating the first operation a plurality of times.

According to yet another embodiment of the present disclosure, there is provided a thin film forming apparatus for forming a thin film on a workpiece accommodated within a reaction chamber, including: a first source gas supplying unit configured to supply a first source gas into the reaction chamber; a second source gas supplying unit configured to supply a second source gas into the reaction chamber; a pressure controlling unit configured to control an internal pressure of the reaction chamber; and a control unit configured to control individual parts of the apparatus, the control unit being configured to form a thin film on the workpiece by alternately performing, a plurality of times, a first operation of supplying the first source gas and the second source gas into the reaction chamber by controlling the first source gas supplying unit and the second source gas supplying unit, and a second operation of stopping the supply of the first source gas by controlling the first source gas supplying unit, supplying the second source gas into the reaction chamber by controlling the second source gas supplying unit, and setting the internal pressure of the reaction chamber higher than an internal pressure of the reaction chamber set in the first operation by controlling the pressure controlling unit.

According to yet another embodiment of the present disclosure, there is provided a thin film forming apparatus for forming a thin film on a workpiece accommodated within a reaction chamber, including: a film forming gas supplying unit configured to supply a film forming gas into the reaction chamber; a modifying-gas supplying unit configured to supply a modifying gas for modification of the thin film formed on the workpiece into the reaction chamber; and a control unit configured to control individual parts of the apparatus, the control unit being configured to form a thin film on the workpiece by alternately performing, a plurality of times, a first operation of, by controlling the film forming gas supplying unit, supplying the film forming gas into the reaction chamber to form the thin film on the workpiece accommodated within the reaction chamber and a modifying operation of, by controlling the modifying-gas supplying unit, supplying the modifying gas for modification of the thin film formed on the workpiece into the reaction chamber, or by performing the modifying operation after a thin film having a desired thickness is formed on the workpiece by repeating the first operation a plurality of times.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A thin film forming method and a thin film forming apparatus according to the present disclosure will now be described in detail. In the following description, the present disclosure will be described by taking, as an example, a case where a HTO (High Temperature Oxide) film is formed. In the present embodiment, description will be made by taking, as an example, a case where a batch-type vertical heat treatment apparatus shown in FIG. 1 is used as the thin film forming apparatus.

Figure 1:
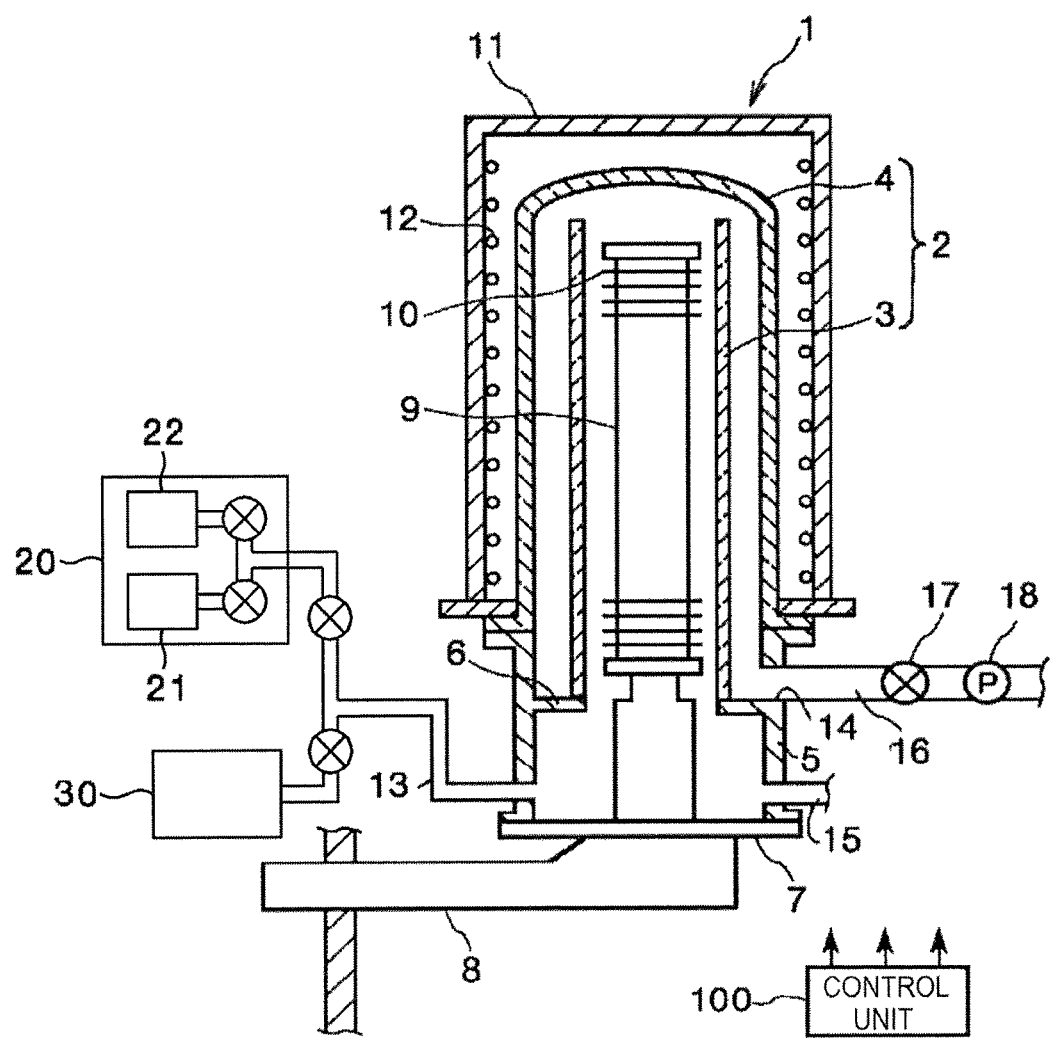
FIG. 1 is a view illustrating a heat treatment apparatus according to an embodiment of the present disclosure.

As illustrated in FIG. 1, a heat treatment apparatus 1 includes a substantially cylindrical reaction tube 2 (reaction chamber) whose longitudinal direction is oriented in a vertical direction. The reaction tube 2 has a double tube structure including an inner tube 3 and a roofed outer tube 4 configured to cover the inner tube 3 and formed to have a specified gap with respect to the inner tube 3. The inner tube 3 and the outer tube 4 are made of a material superior in heat resistance and corrosion resistance, e.g., quartz.

A manifold 5 formed into a tubular shape and made of stainless steel (SUS) is arranged below the outer tube 4. The manifold 5 is air-tightly connected to the lower end of the outer tube 4. The inner tube 3 is supported by a support ring 6 protruding from the inner wall of the manifold 5 and one-piece formed with the manifold 5.

A cover 7 is arranged below the manifold 5 and can be moved up and down by a boat elevator 8. If the cover 7 is moved up by the boat elevator 8, the lower portion (throat portion) of the manifold 5 is closed. If the cover 7 is moved down by the boat elevator 8, the lower portion (throat portion) of the manifold 5 is opened.

A wafer boat 9 made of, e.g., quartz, is placed on the cover 7. The wafer boat 9 is configured to accommodate a plurality of workpieces, e.g., semiconductor wafers 10, with a specified gas left therebetween in the vertical direction.

A heat insulating body 11 is installed around the reaction tube 2 so as to surround the reaction tube 2. Temperature-increasing heaters 12 each formed of, e.g., a resistance heating element, are installed on the inner wall surface of the heat insulating body 11. The interior of the reaction tube 2 is heated to a predetermined temperature by the temperature-increasing heaters 12. As a result, the semiconductor wafers 10 are heated to predetermined temperature.

A plurality of process gas introduction pipes 13 is inserted through (connected to) the side surface of the manifold 5. Only one of the process gas introduction pipes 13 is shown in FIG. 1. The process gas introduction pipes 13 are arranged to face the interior of the inner tube 3. For example, as illustrated in FIG. 1, the process gas introduction pipes 13 are inserted through the side surface of the manifold 5 at the lower side of the support ring 6 (at the lower side of the inner tube 3).

The process gas introduction pipes 13 are connected to a process gas supply source unit 20 (i.e., a film forming gas supplying unit) including a first source gas supplying unit 21 supplying a dichlorosilane (DCS) gas and a second source gas supplying unit 22 supplying a nitrous oxide ($N_2O$) gas through mass flow controllers (not shown). Thus, a desired amount of process gas is supplied from the process gas supply source into the reaction tube 2 through the process gas introduction pipes 13. In the present embodiment, a HTO film is formed. Therefore, film forming gases (source gases) supplied from the process gas introduction pipes 13 are, e.g., a dichlorosilane (DCS) gas as a silicon source and a nitrous oxide ($N_2O$) gas as an oxidizing agent.

An exhaust port 14 for exhausting a gas existing within the reaction tube 2 is installed on the side surface of the manifold 5. The exhaust port 14 is installed more upward than the support ring 6 to communicate with a space defined between the inner tube 3 and the outer tube 4 within the reaction tube 2. An exhaust gas or the like generated within the inner tube 3 is exhausted to the exhaust port 14 through the space defined between the inner tube 3 and the outer tube 4.

A purge gas supply pipe 15 is inserted through the side surface of the manifold 5 at the lower side of the exhaust port 14. A purge gas supply source (not shown) is connected to the purge gas supply pipe 15. A desired amount of a purge gas, e.g., a nitrogen gas, is supplied from the purge gas supply source into the reaction tube 2 through the purge gas supply pipe 15.

An exhaust pipe 16 is air-tightly connected to the exhaust port 14. A valve 17 and a vacuum pump 18 are installed in the exhaust pipe 16 in the named order from the upstream side thereof. The valve 17 adjusts the opening degree of the exhaust pipe 16, thereby regulating the internal pressure of the reaction tube 2 to a predetermined pressure. For example, the orifice or conductance of the valve 17 is adjusted to become smaller, thereby increasing the internal pressure of the reaction tube 2. The valve 17 may be completely closed. Moreover, the internal pressure of the reaction tube 2 may be increased by increasing the flow rate of the process gas. The vacuum pump 18 exhausts the gas existing within the reaction tube 2 through the exhaust pipe 16 and regulates the internal pressure of the reaction tube 2.

A trap (not shown), a scrubber (not shown) and the like are installed in the exhaust pipe 16, whereby the exhaust gas exhausted from the reaction tube 2 is detoxified and then exhausted out of the heat treatment apparatus 1.

Figure 2:
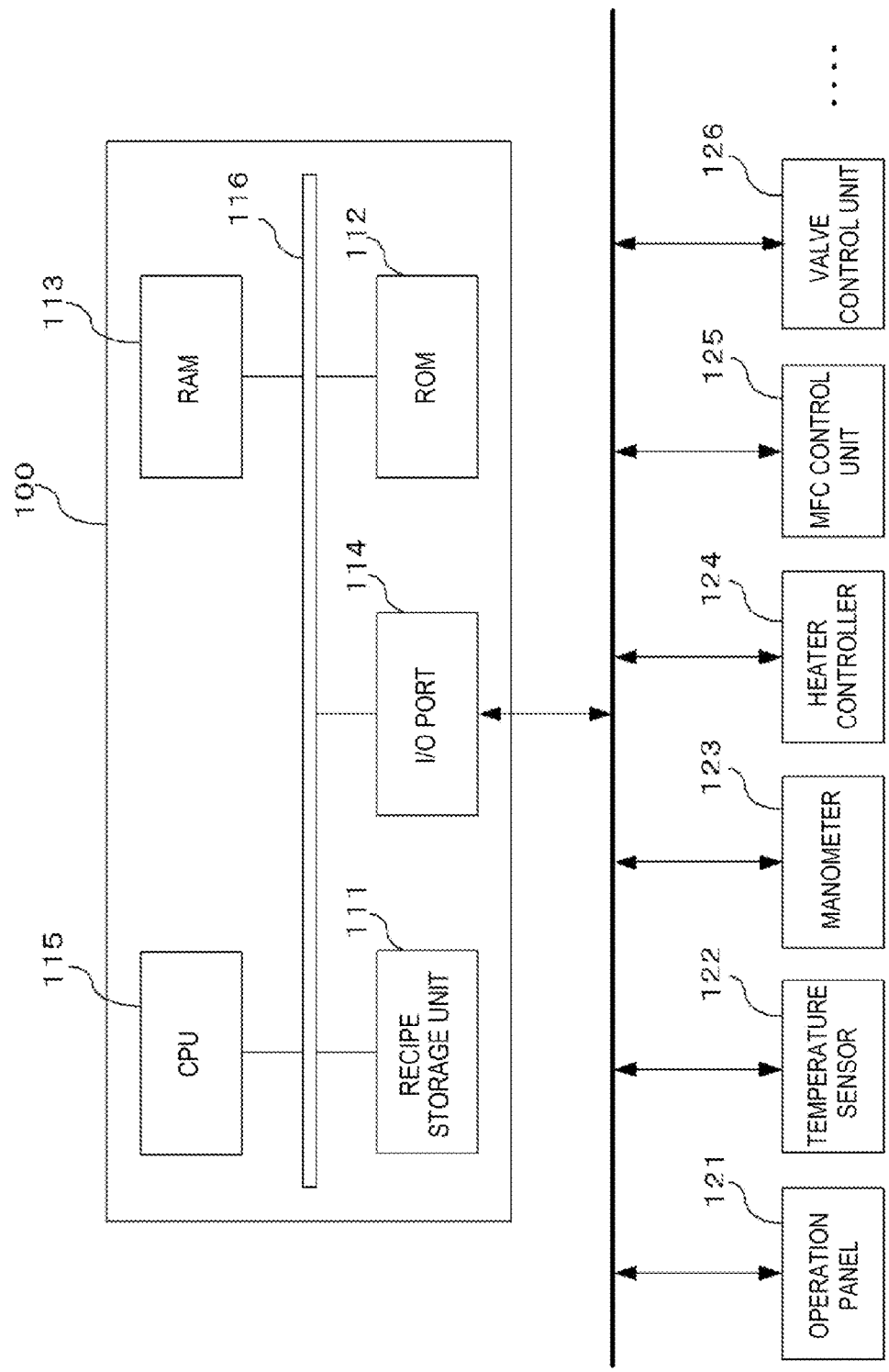
FIG. 2 is a view illustrating a configuration of a control unit of the heat treatment apparatus shown in FIG. 1.

The heat treatment apparatus 1 further includes a control unit 100 configured to control the respective parts thereof. FIG. 2 illustrates the configuration of the control unit 100. As illustrated in FIG. 2, an operation panel 121, a temperature sensor (group) 122, a manometer (group) 123, a heater controller 124, a MFC (Mass Flow Controller) control unit 125, a valve control unit 126 and the like are connected to the control unit 100.

The operation panel 121 is provided with a display screen and an operation button. The operation panel 121 transfers an operator's operation instruction to the control unit 100 and displays different kinds of information coming from the control unit 100 on the display screen.

The temperature sensor (group) 122 measures the temperatures of the respective parts, e.g., the internal temperature of the reaction tube 2, the internal temperature of the process gas introduction pipes 13, the internal temperature of the exhaust pipe 16, and notifies the measured values to the control unit 100.

The manometer (group) 123 measures the pressures of the respective parts, e.g., the internal pressure of the reaction tube 2, the internal pressure of the process gas introduction pipes 13, the internal pressure of the exhaust pipe 16, and notifies the measured values to the control unit 100.

The heater controller 124 is configured to independently control the temperature-increasing heaters 12. Responsive to an instruction sent from the control unit 100, the heater controller 124 applies a current to the temperature-increasing heaters 12 to generate heat. Furthermore, the heater controller 124 measures the power consumption of each of the temperature-increasing heaters 12 and notifies the measured values to the control unit 100.

The MFC control unit 125 controls mass flow controllers (not shown) installed in the process gas introduction pipes 13 and the purge gas supply pipe 15 so that the flow rate of the gas flowing through the mass flow controllers can become equal to the flow rate instructed by the control unit 100. The MFC control unit 125 measures the actual flow rate of the gas and notifies the measured value to the control unit 100.

The valve control unit 126 controls the opening degrees of the valves arranged in the respective pipes so that the opening degrees can become equal to the values instructed by the control unit 100.

The control unit 100 includes a recipe storage unit 111, a ROM (Read Only Memory) 112, a RAM (Random Access Memory) 113, an I/O port (input/output port) 114, a CPU (Central Processing Unit) 115, and a bus 116 configured to interconnect the recipe storage unit 111, the ROM 112, the RAM 113, the I/O port 114 and the CPU 115.

The recipe storage unit 111 stores a setup recipe and a plurality of process recipes. At the time of manufacture of the heat treatment apparatus 1, only the setup recipe is stored in the recipe storage unit 111. The setup recipe is executed when generating thermal models and the like corresponding to individual heat treatment apparatuses. The process recipes are prepared in a corresponding relationship with the heat treatments (heat treatment processes) actually performed by a user. The process recipes define, e.g., a change in the temperature of the respective parts, a change in the internal pressure of the reaction tube 2, start and stop timings of supply of the process gas and a supply amount of the process gas, which are to be used from the time of loading the semiconductor wafers 10 into the reaction tube 2 to the time of unloading the processed semiconductor wafers 10.

The ROM 112 is composed of an EEPROM (Electrically Erasable Programmable Read Only Memory), a flash memory, a hard disc or the like. The ROM 112 is a recording medium configured to store an operation program of the CPU 115 or the like. The RAM 113 serves as a work area of the CPU 115.

The I/O port 114 is connected to the operation panel 121, the temperature sensor (group) 122, the manometer (group) 123, the heater controller 124, the MFC control unit 125, the valve control unit 126 and the like. The I/O port 114 controls the input/output of data and signals.

The CPU 115 serves as a central function of the control unit 100 and executes the control program stored in the ROM 112. Pursuant to the instruction sent from the operation panel 121, the CPU 115 controls the operation of the heat treatment apparatus 1 according to the recipes (process recipes) stored in the recipe storage unit 111. That is to say, the CPU 115 causes the temperature sensor (group) 122, the manometer (group) 123 and the MFC control unit 125 to measure the temperature, pressure and flow rate in the respective areas within the reaction tube 2, the process gas introduction pipes 13 and the exhaust pipe 16. Based on the measured data, the CPU 115 outputs control signals to the heater controller 124, the MFC control unit 125, the valve control unit 126 and the like, thereby controlling the respective parts to follow the process recipes. The bus 116 delivers information between the respective parts.

Next, description will be made on a thin film forming method performed using the heat treatment apparatus 1 configured as above. In the following description, the operations of the respective parts constituting the heat treatment apparatus 1 are controlled by the control unit 100 (the CPU 115). In the respective processes, the internal temperature and pressure of the reaction tube 2 and the flow rate of the gas are set to follow, e.g., the recipe illustrated in FIG. 3, by controlling the heater controller 124 (the temperature-increasing heaters 12), the MFC control unit 125, the valve control unit 126 and the like with the control unit 100 (the CPU 115) as described above. In the present embodiment, as illustrated in FIG. 3, a method of forming a silicon oxide film (a HTO film) using DCS (dichlorosilane) as a silicon source and using $N_2O$ (nitrous oxide) as an oxidizing agent will be described by way of example.

Figure 3:
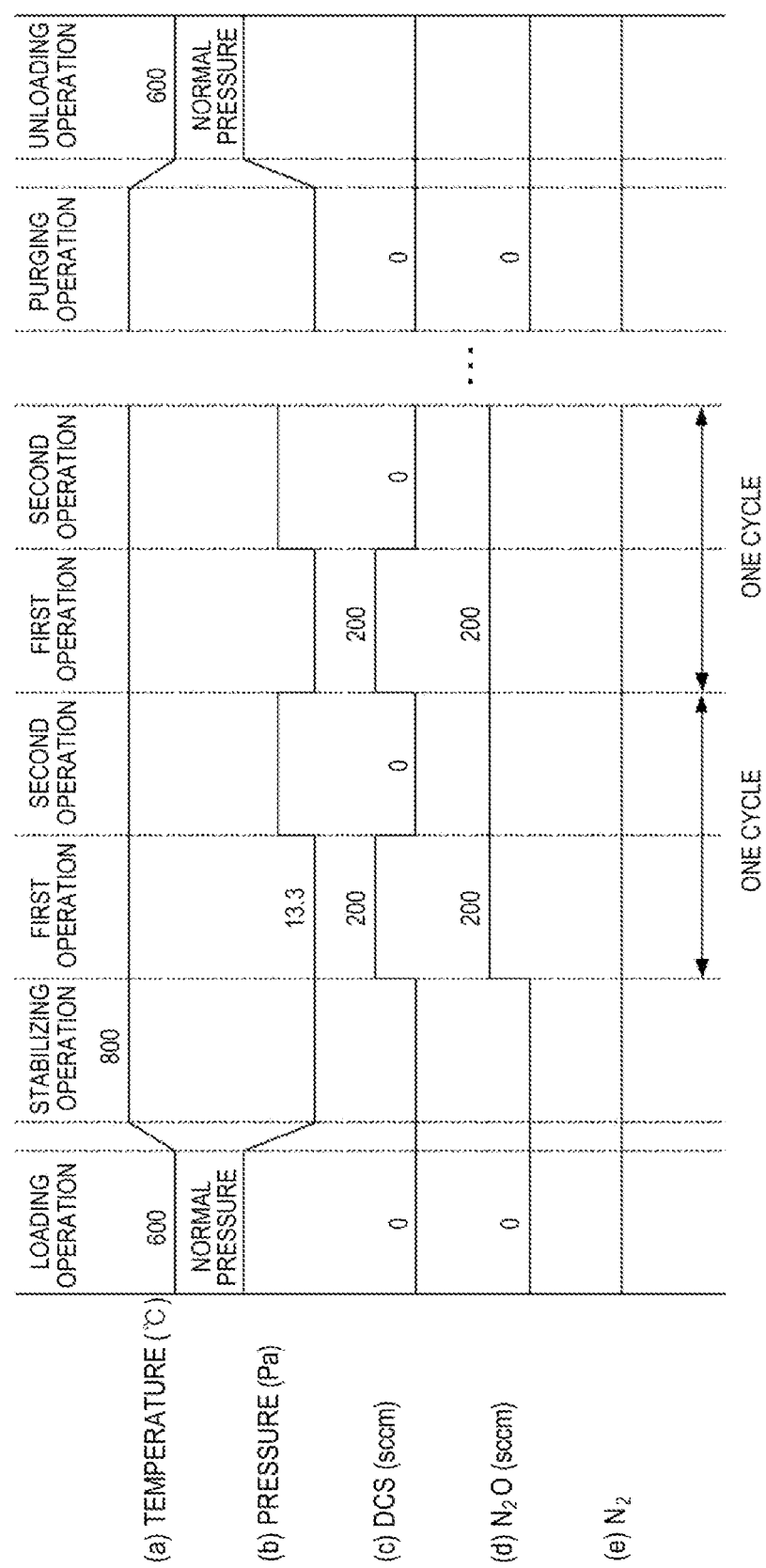
FIG. 3 is a view illustrating a recipe for explaining a thin film forming method according to an embodiment of the present disclosure.

First of all, as shown in an item (a) of FIG. 3, the internal temperature of the reaction tube 2 is set to be equal to a predetermined temperature, e.g., 600 degree C. As shown in an item (e) of FIG. 3, a predetermined amount of nitrogen is supplied from the purge gas supply pipe 15 into the inner tube 3 (the reaction tube 2). Subsequently, the wafer boat 9 which accommodates the semiconductor wafers 10 therein is placed on the cover 7. Then, the cover 7 is moved up by the boat elevator 8 to load the semiconductor wafers 10 (the wafer boat 9) into the reaction tube 2 (Loading Operation). Grooves and/or holes having a so-called STI structure are formed on the surfaces of the semiconductor wafers 10.

Subsequently, as shown in the item (e) of FIG. 3, a predetermined amount of nitrogen is supplied from the purge gas supply pipe 15 into the inner tube 3. As indicated in the item (a) of FIG. 3, the internal temperature of the reaction tube 2 is set to be equal to a predetermined temperature. The gas existing within the reaction tube 2 is exhausted to depressurize the interior of the reaction tube 2 to a predetermined pressure as depicted in an item (b) of FIG. 3. At this time, the internal temperature of the reaction tube 2 is set to be equal to, e.g., 800 degree C., and the internal pressure of the reaction tube 2 is set to be equal to, e.g., 0.1 Torr (13.3 Pa). Then, the interior of the reaction tube 2 is stabilized at this temperature and pressure (Stabilizing Operation).

After the interior of the reaction tube 2 is stabilized at the predetermined pressure and temperature, as shown in an item (c) of FIG. 3, a predetermined amount of a DCS gas as a first film forming gas (a source gas) is introduced from the process gas introduction pipes 13 into the reaction tube 2. At this time, in the present embodiment, the DCS gas is supplied at a flow rate of 200 sccm as shown in the item (c) of FIG. 3. Simultaneously with the supply of the first film forming gas, a $N_2O$ gas as a second film forming gas (a source gas) is supplied from the process gas introduction pipes 13 into the reaction tube 2 as indicated in an item (d) of FIG. 3. The $N_2O$ gas is supplied at a flow rate of 200 sccm as shown in the item (d) of FIG. 3. At this time, the internal pressure of the reaction tube 2 is kept at 0.1 Torr (13.3 Pa) as shown in the item (b) of FIG. 3 (First Operation). The first operation is maintained for a predetermined time, e.g., about 1 minute.

In this regard, when supplying the film forming gases in the first operation, it is preferred in some embodiments that the film forming gases are supplied into the reaction tube 2 at the predetermined flow rate by gradually increasing the flow rate of the film forming gases and not by suddenly supplying the film forming gases into the reaction tube 2 at the predetermined flow rate (200 sccm).

Subsequently, as shown in the item (c) of FIG. 3, the supply of the DCS gas as the first film forming gas is stopped and, as indicated in the item (b) of FIG. 3, the internal pressure of the reaction tube 2 is set higher than the pressure set in the first operation. For example, the internal pressure of the reaction tube 2 is set to be equal to 0.1 Torr to 10 Torr (13.3 Pa to 1330 Pa). As shown in the item (d) of FIG. 3, the supply of the $N_2O$ gas as the second film forming gas is not stopped but is kept at a flow rate of 200 sccm (Second Operation). The second operation is maintained for a predetermined time, e.g., about 1 minute.

Subsequently, as shown in the items (b) and (c) of FIG. 3, the first operation is performed again in which the DCS gas as the first film forming gas is supplied and in which the internal pressure of the reaction tube 2 is reduced. Moreover, the supply of the $N_2O$ gas as the second film forming gas is maintained as indicated in the item (d) of FIG. 3. In this operation, the flow rate of the first film forming gas, the flow rate of the second film forming gas, the internal pressure of the reaction tube 2 and the operation maintaining time are set to be equal to those of the first operation of the previous cycle.

Then, the second operation is performed again in which the supply of the DCS gas as the first film forming gas is stopped and in which the internal pressure of the reaction tube 2 is increased as shown in the item (b) of FIG. 3. Moreover, the supply of the $N_2O$ gas is not stopped but is kept at a flow rate of 200 sccm as indicated in the item (d) of FIG. 3. In this operation, the flow rate of the second film forming gas, the internal pressure of the reaction tube 2 and the operation maintaining time are set to be equal to those of the second operation of the previous cycle.

In this way, a cycle including the first operation and the second operation is performed a predetermined number of times, thereby forming a HTO film having a predetermined thickness on each of the semiconductor wafers 10. The number of repetitions of the cycle in some embodiments is, e.g., about 75 to 225. The number of repetitions of the cycle is decided depending on the required film thickness or the like.

In the present embodiment, the supply and stop of the DCS gas as the first film forming gas is repeatedly performed. The supply of the $N_2O$ gas as the second film forming gas is maintained without regard to the supply of the first film forming gas. The internal pressure of the reaction tube 2 is kept higher when the first film forming gas is stopped rather than when the first film forming gas is supplied. Since the internal pressure of the reaction tube 2 is lower in the first operation than in the second operation, it becomes easy to spread out the DCS gas and the $N_2O$ gas over the semiconductor wafers 10 having grooves and/or holes. Inasmuch as the $N_2O$ gas is supplied at a higher pressure in the second operation than in the first operation, it is possible to accelerate the reaction (oxidation) of the DCS gas and the $N_2O$ gas which are spread out over the semiconductor wafers 10 having grooves and/or holes. This makes it possible to enhance the coverage performance of the HTO film formed on each of the semiconductor wafers 10.

If the HTO film having a predetermined thickness is formed, the supply of the film forming gases from the process gas introduction pipes 13 is stopped. Then, the film forming gases are discharged from the interior of the reaction tube 2. As shown in the item (e) of FIG. 3, a predetermined amount of nitrogen is supplied from the purge gas supply pipe 15 into the inner tube 3, thereby discharging the gases remaining within the reaction tube 2 (Purging Operation).

Subsequently, as shown in the item (a) of FIG. 3, the internal temperature of the reaction tube 2 is set to be equal to a predetermined temperature, e.g., 600 degree C. The gases remaining within the reaction tube 2 are discharged and the reaction tube 2 is returned to normal pressure. Then, the cover 7 is moved down by the boat elevator 8, thereby unloading the semiconductor wafers 10 (the wafer boat 9) from the interior of the reaction tube 2 (Unloading Operation). Thus, the formation of a laminated film is finished.

Figure 4:
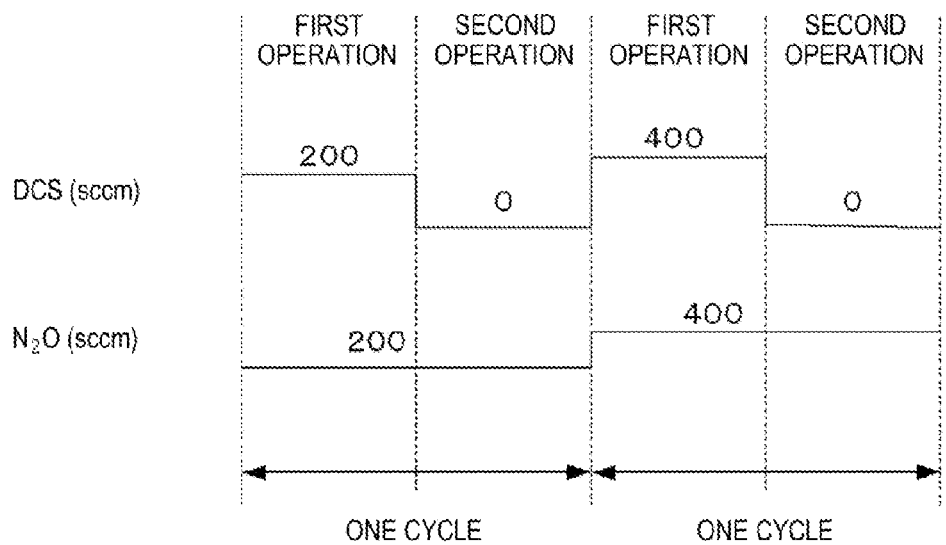
FIG. 4 is a view illustrating another example of the recipe for explaining the thin film forming method.

The present disclosure is not limited to the aforementioned embodiment but may be modified or applied in many different forms. In the aforementioned embodiment, a configuration in which the flow rates of the film forming gases (the DCS gas and the $N_2O$ gas) are equally set in the respective cycles is taken as an example. However, for example, as illustrated in FIG. 4, the flow rates of the film forming gases may be differently set depending on the cycle. In addition, the flow rates of the DCS gas and the $N_2O$ gas may be differently set in the respective cycles.

In the aforementioned embodiment, a configuration in which the flow rates of the film forming gases (the DCS gas and the $N_2O$ gas) are equally set in the first operation and the second operation is taken as an example. However, for example, the flow rates of the film forming gases in the first operation may be set different from the flow rates of the film forming gases in the second operation. Moreover, the second operation may be set longer than the first operation in such a way that the first operation maintaining time becomes equal to 1 minute and the second operation maintaining time becomes equal to 2 minutes. Conversely, the first operation may be set longer than the second operation.

Figure 5:
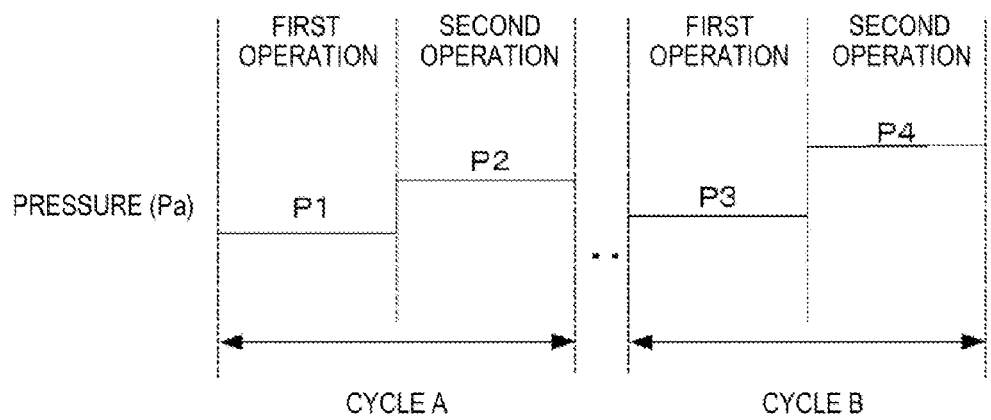
FIG. 5 is a view illustrating a further example of the recipe for explaining the thin film forming method.

In the present disclosure, it is preferred in some embodiments that the internal pressure (P2 or P4) of the reaction tube 2 in the second operation is set higher than the internal pressure (P1 or P3) of the reaction tube 2 in the first operation. The internal pressure of the reaction tube 2 may be differently set depending on the cycle. For example, as illustrated in FIG. 5, cycle A may be performed a plurality of times and, then, cycle B may be performed a plurality of times. In this case, it is preferred that the internal pressure P3 of the reaction tube 2 in the first operation of cycle B is set higher than the internal pressure P1 of the reaction tube 2 in the first operation of cycle A (P3>P1). This is because it is possible to enhance the coverage performance and the deposition rate. In addition, the internal pressure P2 or P4 of the reaction tube 2 in the second operation may be changed to a great extent. For example, the internal pressure P4 of the reaction tube 2 in the second operation of cycle B may be set significantly higher than the internal pressure P2 of the reaction tube 2 in the second operation of cycle A (P4>>P2). In the aforementioned embodiment, description has been made by taking, as an example, a case where the internal temperature of the reaction tube 2 is set to be equal to 800 degree C. However, the internal temperature of the reaction tube 2 may be appropriately changed.

In the aforementioned embodiment, the present disclosure has been described by taking, as an example, a case where the DCS gas is used as the silicon source, i.e., the first film forming gas, and where the $N_2O$ gas as the oxidizing agent is used as the second film forming gas. However, other materials may be used as long as the materials are capable of forming a HTO film (a $SiO_2$ film). For example, tetrachlorosilane, trichlorosilane or hexachlorodisilane (HCD) may be used as the silicon source. Nitrogen oxide (NO), nitrogen dioxide ($NO_2$) or ozone ($O_3$) may be used as the oxidizing agent. A SiN film may be formed in place of the HTO film.

Figure 6:
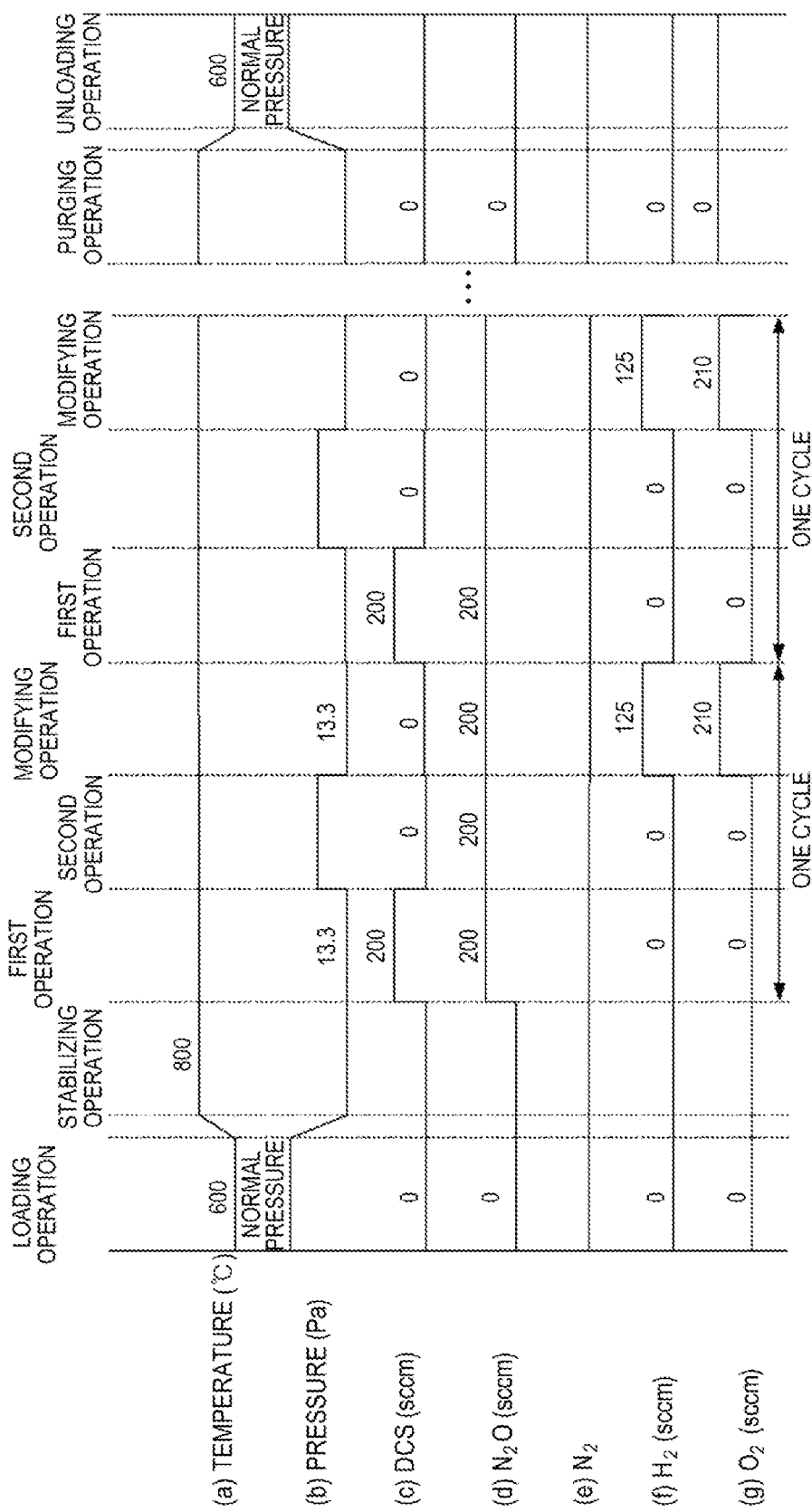
FIG. 6 is a view illustrating a still further example of the recipe for explaining the thin film forming method.

As illustrated in FIG. 6, after the first operation and the second operation, it may be possible to perform a modifying operation in which modifying gases, e.g., oxygen ($O_2$) and hydrogen ($H_2$), are supplied from a modifying gas supplying unit 30 through the process gas introduction pipes 13 into the reaction tube 2 to generate active species (radicals) containing oxygen within the reaction tube 2. The modifying gases are not limited to hydrogen ($H_2$) and oxygen ($O_2$) but may be any gas that can modify the HTO film. For example, the modifying gases may be hydrogen ($H_2$) and nitrous oxide ($N_2O$). The modifying operation is performed for a predetermined time, e.g., 1 to 60 seconds, preferably 5 to 15 seconds. In the modifying operation, the formed thin film (the HTO film) and the activated oxygen and hydrogen (radicals) react with each other, which makes it possible to reduce the concentration of impurities such as chlorine (Cl), hydrogen (H), carbon (C), nitrogen (N) and the like contained in the HTO film. For example, the concentration of chlorine in the formed HTO film was measured. As a result, it was confirmed that the concentration of chlorine in the HTO film can be significantly reduced by performing the modifying operation. It was also confirmed that the film stress of the HTO film can be made larger. In particular, it was confirmed that the film stress in a Y-axis direction can be increased approximately four times.

In the modifying operation, it is preferred in some embodiments that the internal temperature of the reaction tube 2 is set to be equal to 700 degree C. to 900 degree C. This is because, by setting the internal temperature of the reaction tube 2 to fall within this range, it becomes easy to remove impurities such as chlorine, hydrogen and the like contained in the HTO film and easy to modify the HTO film. Particularly, in the modifying operation, it is preferred in some embodiments that the internal temperature of the reaction tube 2 is set to be equal to about the HTO film forming temperature (800 degree C.), e.g., 750 degree C. to 850 degree C. This is because, by setting the internal temperature of the reaction tube 2 to fall within this range, it becomes possible to easily control the internal temperature of the reaction tube 2.

In the modifying operation, it is preferred in some embodiments that the internal pressure of the reaction tube 2 is set to be equal to 1.33 Pa to 133 Pa (0.01 Torr to 1 Torr). This is because, by setting the internal pressure of the reaction tube 2 to fall within this range, it becomes easy to remove impurities such as chlorine, hydrogen and the like contained in the HTO film and easy to modify the HTO film. In particular, it is preferred in some embodiments that the internal pressure of the reaction tube 2 is set to be equal to 6.65 Pa to 13.3 Pa (0.05 Torr to 0.1 Torr). This is because, by setting the internal pressure of the reaction tube 2 to fall within this range, it becomes possible to improve the interfacial uniformity of the formed HTO film.

In the modifying operation, the ratio of the supply amounts of hydrogen ($H_2$) and oxygen ($O_2$) is in some embodiments preferably 1:1 to 1:3, more preferably 1:1.5 to 1:2. This is because, by setting the mixing ratio of oxygen and hydrogen to fall within this range, it becomes possible to reduce the concentration of impurities contained in the HTO film and to increase the film stress of the HTO film.

Figure 7:
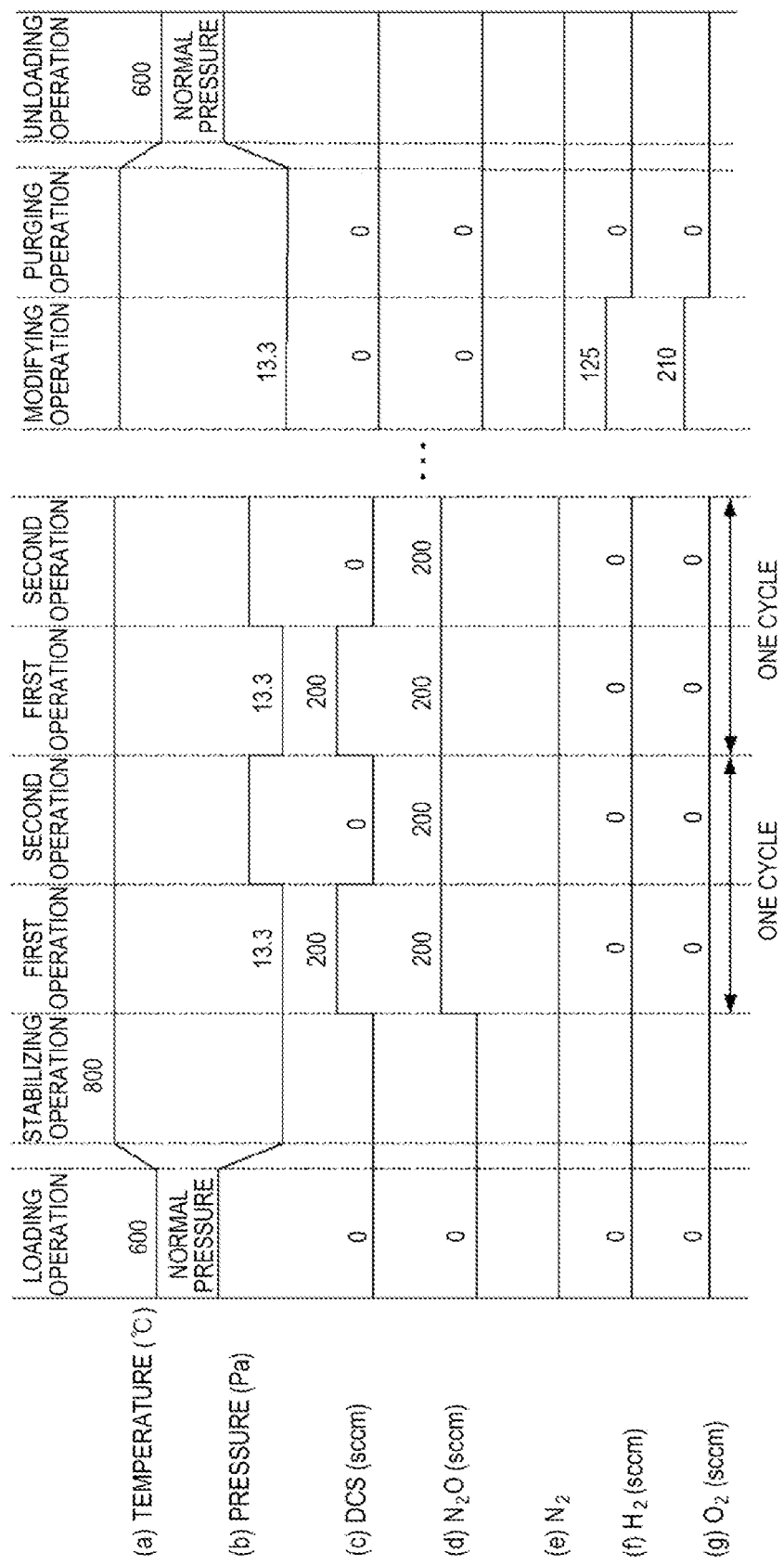
FIG. 7 is a view illustrating a yet still further example of the recipe for explaining the thin film forming method.

The modifying operation may not be performed in each and every cycle. For example, during the initial several cycles, the first operation and the second operation may be performed without performing the modifying operation. Thereafter, the first operation, the second operation and the modifying operation may be performed. As illustrated in FIG. 7, the modifying operation may be performed after the HTO film having a desired thickness is formed. In these cases, it is possible to reduce the concentration of impurities contained in the HTO film and to increase the film stress of the HTO film.

Figure 8:
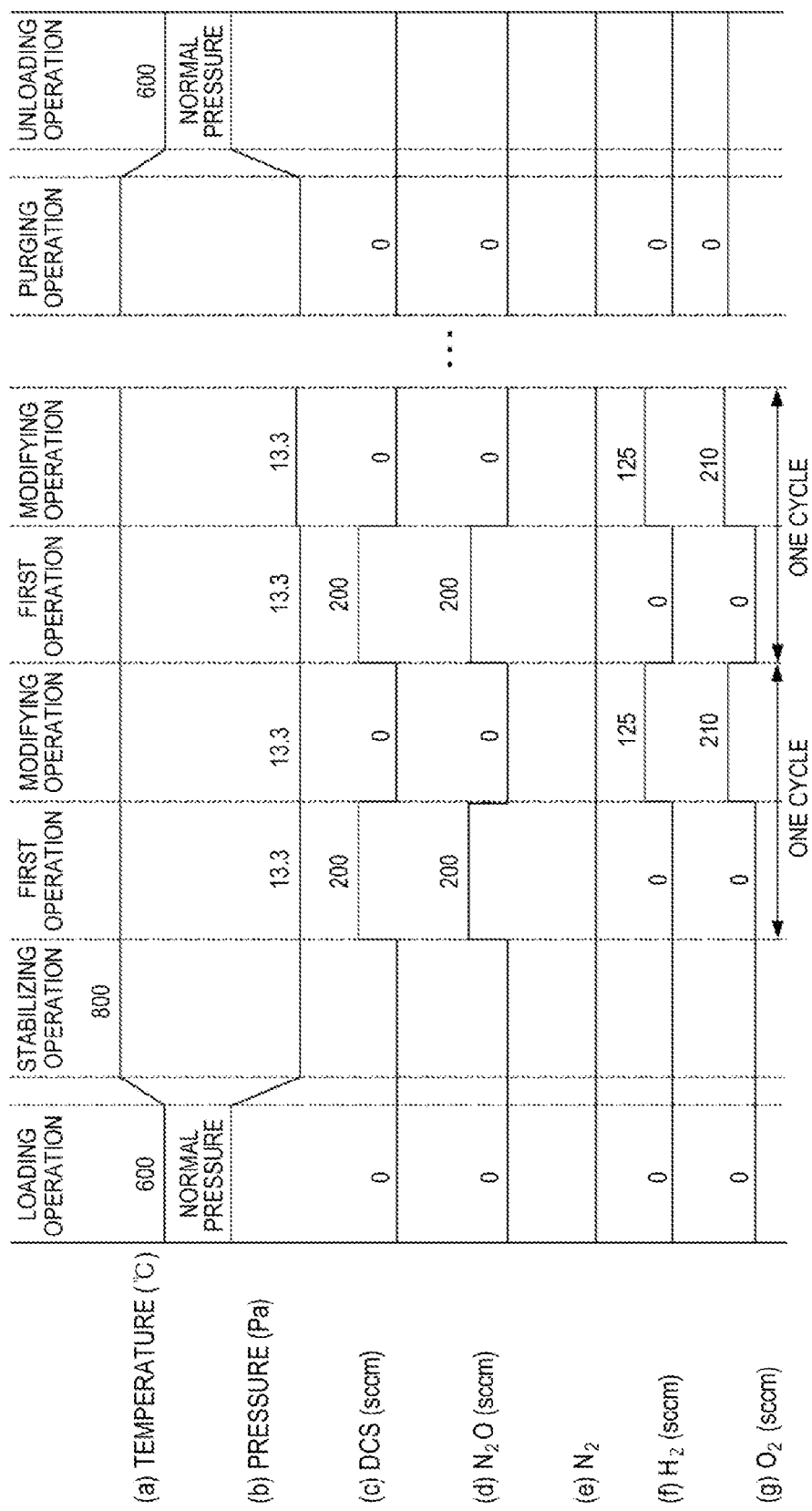
FIG. 8 is a view illustrating an even yet still further example of the recipe for explaining the thin film forming method.

As illustrated in FIG. 8, the modifying operation may be performed in place of the second operation. Even in this case, it is possible to reduce the concentration of impurities contained in the HTO film and to increase the film stress of the HTO film. In this case, it is possible to significantly reduce the concentration of chlorine in the HTO film. In particular, it was confirmed that the concentration reduction in the film depth direction is remarkable.

Figure 9:
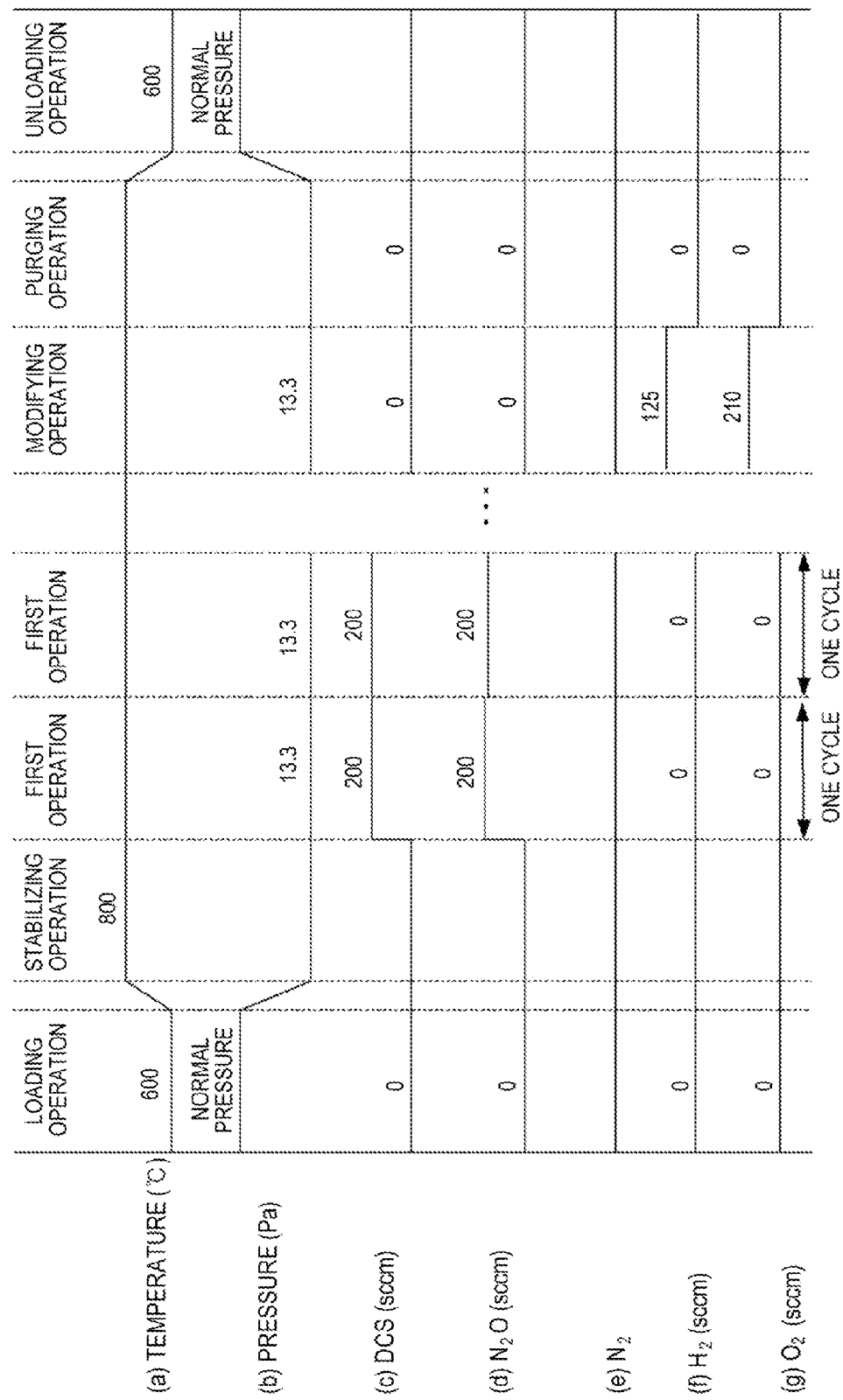
FIG. 9 is a view illustrating an additional even yet still further example of the recipe for explaining the thin film forming method.

As illustrated in FIG. 9, the modifying operation may be performed after the HTO film having a desired thickness is formed by repeating the first operation a plurality of times. Even in this case, it is possible to reduce the concentration of impurities contained in the HTO film and to increase the film stress of the HTO film.

In the aforementioned embodiment, the present disclosure has been described by taking, as an example, a case where the batch-type vertical heat treatment apparatus having a double tube structure is used as the thin film forming apparatus. However, the present disclosure can be applied to, e.g., a batch type heat treatment apparatus having a single tube structure.

The control unit 100 according to an embodiment of the present disclosure can be realized by an ordinary computer system without resorting to a dedicated system. For example, the control unit 100 for performing the aforementioned processes can be formed by installing, in a general-purpose computer, the program downloaded from a recording medium (a flexible disc, a CD-ROM (Compact Disc-Read Only Memory) or the like) which stores a program for performing the aforementioned processes.

An arbitrary means can be used to supply the program. In addition to supplying the program through a specified recording medium, it may be possible to supply the program through, e.g., a communication line, a communication network, a communication system or the like. In this case, for example, the program may be posted to a BBS (Bulletin Board System) of a communication network and may be provided through a network in a state that the program overlaps with a carrier wave. Then, the program thus provided is started up and is executed under the control of an OS (Operating System) just like other application programs. This makes it possible to perform the aforementioned processes.

The present disclosure is useful in a thin film forming method and a thin film forming apparatus.

According to the present disclosure, it is possible to provide a thin film forming method and a thin film forming apparatus, which are capable of forming a thin film having good properties.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A thin film forming apparatus for forming a thin film on a workpiece accommodated within a reaction chamber, the apparatus comprising:
    a first source gas supplying unit configured to supply a first source gas into the reaction chamber;
    a second source gas supplying unit configured to supply a second source gas into the reaction chamber;
    a plurality of gas introduction pipes, through which the first source gas and the second source gas are supplied, configured to deliver the first source gas and the second source gas to a lower side of the reaction chamber and connected to the first source gas supplying unit and the second source gas supplying unit;
    a pressure controlling unit configured to control an internal pressure of the reaction chamber; and
    a control unit configured to control individual parts of the apparatus,
    the control unit being configured to form a thin film on the workpiece by alternately performing, a plurality of times, a first operation of supplying the first source gas and the second source gas into the reaction chamber by controlling the first source gas supplying unit and the second source gas supplying unit, and a second operation of stopping the supply of the first source gas by controlling the first source gas supplying unit, supplying the second source gas into the reaction chamber by controlling the second source gas supplying unit, and setting the internal pressure of the reaction chamber higher than an internal pressure of the reaction chamber set in the first operation by controlling the pressure controlling unit,
    wherein the first source gas comprises dichlorosilane and the second source gas comprises nitrous oxide.

2. The apparatus of claim 1, further comprising:
    a modifying-gas supplying unit configured to supply a modifying gas for modification of the thin film formed on the workpiece into the reaction chamber,
    wherein the control unit is configured to form a thin film on the workpiece by repeating, a plurality of times, the first operation, the second operation and a modifying operation of, by controlling the modifying-gas supplying unit, supplying the modifying gas into the reaction chamber to modify the thin film formed on the workpiece.

3. The apparatus of claim 1, further comprising:
    a modifying-gas supplying unit configured to supply a modifying gas for modification of the thin film formed on the workpiece into the reaction chamber,
    wherein the control unit is configured to form a thin film on the workpiece by performing a modifying operation of, by controlling the modifying-gas supplying unit, supplying the modifying gas into the reaction chamber to modify the thin film formed on the workpiece, after a thin film having a desired thickness is formed on the workpiece by alternately repeating the first operation and the second operation a plurality of times.

4. The apparatus of claim 2, wherein the modifying gas includes oxygen and hydrogen.

5. The apparatus of claim 1, wherein a groove or a hole is formed on the workpiece and the thin film is formed in the groove or the hole.

* * * * *